(12) United States Patent
Kobayashi (10) Patent No.: US 7,969,495 B2
(45) Date of Patent: Jun. 28, 2011

(54) METHOD FOR DRIVING CCD-TYPE SOLID-STATE IMAGING DEVICE AND IMAGING APPARATUS

(75) Inventor: Hirokazu Kobayashi, Saitama (JP)

(73) Assignee: Fujifilm Corporation, Tokyo (JP)

( * ) Notice: Subject to any disclaimer, the term of this patent is extended or adjusted under 35 U.S.C. 154(b) by 457 days.

(21) Appl. No.: 12/118,317

(22) Filed: May 9, 2008

(65) Prior Publication Data

US 2009/0002537 A1 Jan. 1, 2009

(30) Foreign Application Priority Data

May 18, 2007 (JP) ................ P2007-133100

(51) Int. Cl.
*H04N 5/335* (2011.01)
*H04N 5/217* (2011.01)

(52) U.S. Cl. ........................ 348/314; 348/241

(58) Field of Classification Search ........... 348/241, 348/249, 250, 311–319
See application file for complete search history.

(56) References Cited

U.S. PATENT DOCUMENTS

| 3,986,198 | A | * | 10/1976 | Kosonocky | 257/237 |
| 4,951,148 | A | * | 8/1990 | Esser et al. | 348/249 |
| 5,325,412 | A | * | 6/1994 | Stekelenburg | 377/58 |
| 5,432,551 | A | * | 7/1995 | Matsunaga | 348/299 |
| 6,441,851 | B1 | * | 8/2002 | Yonemoto | 348/294 |
| 7,218,346 | B1 | * | 5/2007 | Nakashiba | 348/248 |

FOREIGN PATENT DOCUMENTS

JP 2005-286470 A 10/2005

* cited by examiner

*Primary Examiner* — David L Ometz
*Assistant Examiner* — Ahmed A Berhan
(74) *Attorney, Agent, or Firm* — Birch, Stewart, Kolasch & Birch, LLP (57) ABSTRACT

A method for driving a CCD-type solid-state imaging device includes: reading charges detected by photoelectric conversion elements into potential packets A (B) formed in a charge transfer path, dividing each potential packet A (B) into plural segment packets A1, A2 (B1, B2) while narrowing a range where the charges are present in each potential packet A (B), by moving a split barrier D from one side of each potential packet A (B) toward the other side of each potential packet A (B), and transferring the charges along the charge transfer path after the dividing. Each split barrier D has a lower potential height than a partition barrier C that forms a boundary between the adjacent potential packets A, B.

18 Claims, 7 Drawing Sheets

METHOD FOR DRIVING CCD-TYPE SOLID-STATE IMAGING DEVICE AND IMAGING APPARATUS

CROSS-REFERENCE TO RELATED APPLICATIONS

This application is based upon and claims the benefit of priority from the Japanese Patent Application No. 2007-133100 filed on May 18, 2007, the entire contents of which are incorporated herein by reference.

BACKGROUND OF THE INVENTION

1. Technical Field

The invention relates to a method for driving a CCD (Charge Coupled Device) type solid-state imaging device and an imaging apparatus, and more particularly, to a method for driving a CCD-type solid-state imaging device and an imaging apparatus, which are suitable to reduce a dark current component contained in a low luminance image portion of a taken image.

2. Description of the Related Art

CCD-type solid-state imaging devices are configured to transfer signal charges detected by photoelectric conversion elements via charge transfer paths, for output. Therefore, a dark current may be mixed into the signal charges during the charge transfer. The influence of the dark current increases when a signal component, i.e., a signal charge amount is small, while the dark current has less influence on a high luminance image formed from a large amount of signal charges.

JP 2005-286470 A describes that when it is determined based on an imaging condition such as ISO sensitivity that an incident light amount is small a camera photographs a subject, the capacity of potential packets for charge transfer, i.e., the number of transfer electrodes is decreased. On the other hand, when it is determined that the incident light amount is great, the capacity of potential packets is increased. In this manner, JP 2005-286470 A suppresses the dark current from being mixed when the incident light amount is small.

The amount of the dark current generated increases as the capacity of the potential packets increases. Therefore, if the capacity of the potential packets is decreased when the incident light amount is small and when the signal charge amount is small as described in JP 2005-286470 A, it becomes possible to decrease the amount of dark current generated and thus to increase an S/N ratio.

As described above, by decreasing the capacity of the potential packets used in the charge transfer when the incident light amount is small, it is possible to decrease the dark current. However, in JP 2005-286470 A, the capacity of the potential packets is controlled equally to increase or decrease, based on the imaging condition that the incident light amount is large or small. Therefore, for example, a dark-current component contained in a dark image portion, such as a shadow portion, of a high luminance photographic image taken under an imaging condition of a large incident light amount may become large relative to the signal charge amount. In this case, the S/N ratio can be increased in the high luminance image portion; however, the S/N ratio may decrease in a dark, low luminance image portion. As a result, it may be difficult to obtain a high quality image over the whole screen.

This phenomenon can be resolved by decreasing the capacity of the potential packets to a certain extent, under the imaging condition of the large incident light amount. However, by doing so, it is necessary to decrease a saturation signal charge amount of the high luminance image, which may narrow a dynamic range of an image.

SUMMARY OF THE INVENTION

The invention provides a method for driving a CCD-type solid-state imaging device and an imaging apparatus, which can take a high quality photographic image over a whole screen without narrowing a dynamic range of an image.

According to one aspect of the invention, a method for driving a CCD-type solid-state imaging device includes: reading charges detected by photoelectric conversion elements into potential packets formed in a charge transfer path; dividing each potential packet into plural segment packets while narrowing a range where the charges are present in each potential packet, by moving a split barrier from one side of each potential packet toward the other side of each potential packet, wherein each split barrier has a lower potential height than a partition barrier that forms a boundary between the adjacent potential packets; and transferring the charges along the charge transfer path after the dividing.

The method for driving the CCD-type solid-state imaging device may further include making the barrier heights of the split barriers be equal to that of the partition barriers before the transferring.

In the method for driving the CCD-type solid-state imaging device, a direction in which the split barriers are moved may be the same as a direction in which the charges are transferred.

In the method for driving the CCD-type solid-state imaging device, the plurality of segment potential packets may be formed to have the same capacity.

According to another aspect of the invention, an imaging apparatus includes a CCD-type solid-state imaging device and a driving control unit. The CCD-type solid-state imaging device includes a plurality of photoelectric conversion elements arranged in two-dimensional array, and a charge transfer path. The driving control unit forms potential packets in the charge transfer path, reads charges detected by the photoelectric conversion elements into the potential packets, divides each potential packet into plural segment packets while narrowing a range where the charges are present in each potential packet, by moving a split barrier from one side of each potential packet toward the other side of each potential packet, and transfers the charges along the charge transfer path after the dividing. Each split barrier has a lower potential height than a partition barrier that forms a boundary between the adjacent potential packets, and In the imaging apparatus, the driving control unit may make the barrier heights of the split barriers be equal to that of the partition barriers before the driving control unit transfers the charges.

In the imaging apparatus, the driving control unit may control so that a direction in which the split barriers are moved is the same as a direction in which the charges are transferred.

In the imaging apparatus, the driving control unit may control so that the plurality of segment potential packets are formed to have the same capacity.

The imaging apparatus may further include a signal processing unit that synthesizes signals obtained from the charges transferred by the plural segment packets, which are formed by dividing each potential packet, to generate image data for the photoelectric conversion element corresponding to each potential packet.

In the imaging apparatus, when it is determined that any of the plural segment packets, which are obtained by dividing one potential packet, is an empty packet, the signal processing unit may synthesize signals obtained from the charges transferred by segment packets, which are formed by dividing the one potential packet but are not the empty packet, to generate the image data and does not add a signal obtained from the empty packet.

In the imaging apparatus, when it is determined that any of the plural segment packets, which are obtained by dividing one potential packet, is an empty packet, the signal processing unit may correct signals obtained from the charges transferred by the segment packets other than the empty packet, using as a dark-current noise signal a signal obtained from charges transferred by the empty packet.

In the imaging apparatus, when it is determined that none of the plural segment packets, which are obtained by dividing one potential packet, is an empty packet, the signal processing unit may add the signals obtained from the charges transferred by the respective segment packets to generate the image data for the photoelectric conversion element corresponding to the one potential packet.

With the above configuration, the capacity of the potential packets is decreased during transfer. Hence, it is possible to decrease a dark current mixed into signal charges. In addition, even when an empty packet is generated among segment potential packets, signals of the empty packet are not added. Therefore, it is possible to decrease a dark current in a low luminance portion (dark portion) in an taken image of one screen and thus to obtain a high quality image.

DETAILED DESCRIPTION OF EMBODIMENTS OF THE INVENTION

Now, embodiments of the invention will be described with reference to the drawings.

Figure 1:
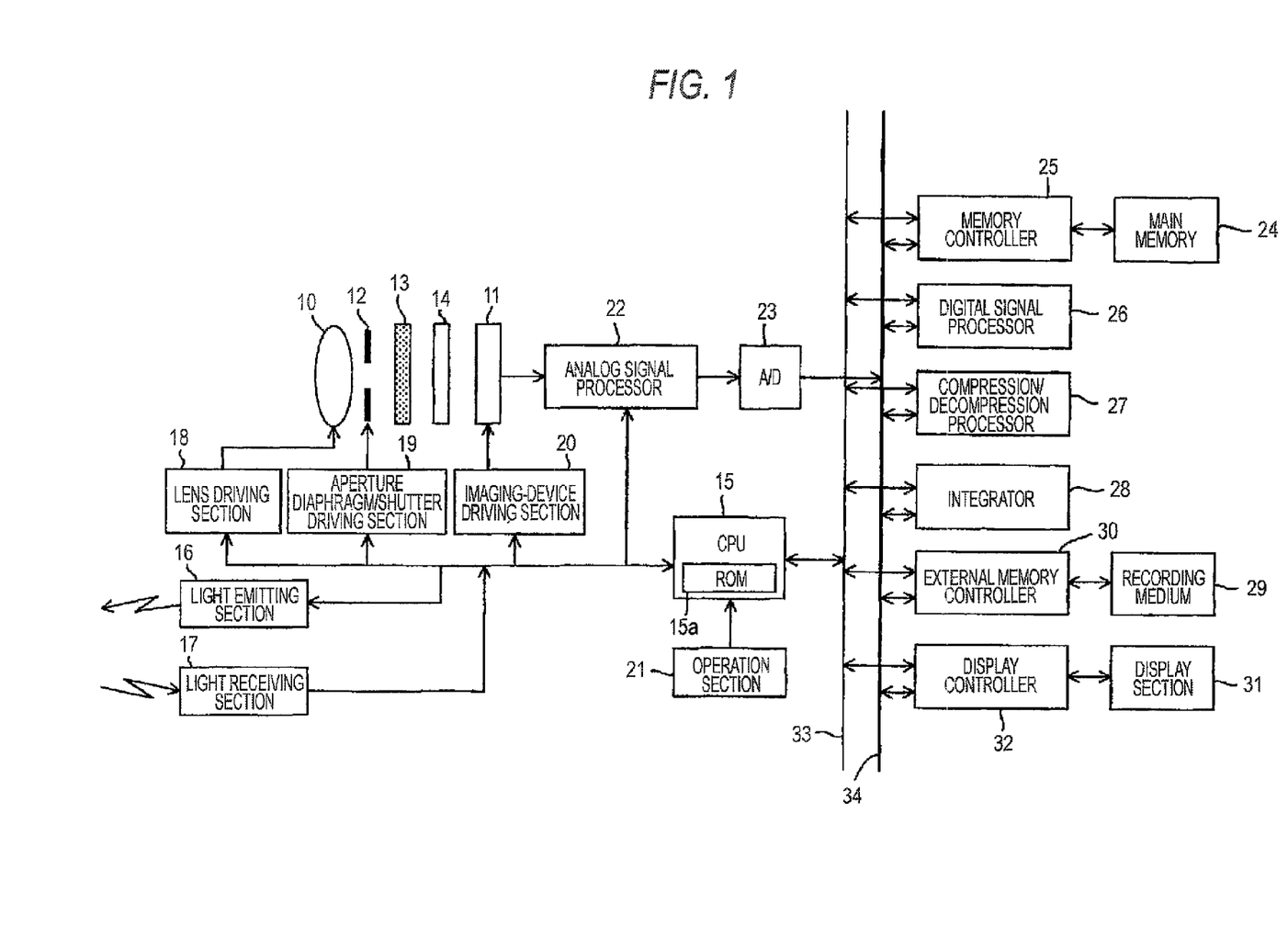
FIG. 1 is a block diagram showing the configuration of a digital still camera according to an embodiment of the invention.

FIG. 1 is a diagram showing the configuration of a digital still camera according to a first embodiment of the invention. This embodiment will be described by way of an example of a digital still camera. However, the invention can be applied to a digital video camera or other digital cameras, for example, one mounted on a small electronic device such as a mobile phone.

The digital still camera shown in FIG. 1 includes an imaging lens 10, a CCD-type solid-state imaging device 11, and an aperture diaphragm and a mechanical shutter 12 that are disposed between the imaging lens 10 and the solid-state imaging device 11, an infrared cut filter 13, and an optical low-pass filter 14. A CPU 15 controls the overall operation of the digital still camera. The CPU 15 also controls a flash light emitting section 16 and a light receiving section 17. The CPU 15 also controls a lens driving section 18 to adjust a position of the imaging lens 10 to be located in a focusing position. The CPU 15 also controls an opening size of an aperture diaphragm via an aperture diaphragm/shutter driving section 19 to adjust an exposure amount to be appropriate. The CPU 15 also controls the closing timing of the mechanical shutter 12.

In addition, the CPU 15 drives the solid-state imaging device 11 via an imaging-device driving section 20 in a certain manner (which will be described in detail later), thereby outputting an image of a subject taken by the imaging lens 10 as a color signal. A command signal from a user is input to the CPU 15 via an operation section 21, and the CPU 15 executes various controls according to the command.

The CPU 15 includes a ROM 15a in which various data are set, and the size of a saturation capacity of segment potential packets is set in the ROM 15a. The saturation capacity of the segment potential packets will be described in detail later.

The operation section 21 includes a shutter button. When the shutter button is pressed halfway (switch S1), a focusing adjustment and the like are performed, while when the shutter button is pressed completely (switch S2), photographing is performed.

An electrical control system of the digital still camera includes an analog signal processor 22 connected to the output of the solid-state imaging device 11 and an A/D conversion circuit 23 that converts an RGB color signal output from the analog signal processor 22 into a digital signal. The CPU 15 controls the analog signal processor 22 and the A/D conversion circuit 23.

The electrical control system of the digital still camera also includes a main controller 25 connected to a main memory 24, a digital signal processor 26, a compression/decompression processor 27 that compresses the taken image to a JPEG image or decompresses the compressed image, an integrator 28 that integrates photometric data to adjust a white balance gain, an external memory controller 30 to which a removable recording medium 29 is connected, and a display controller 32 to which a liquid crystal display section 31 mounted on a rear surface or the like of the camera is connected. The respective components are connected to each other via a control bus 33 and a data bus 34 and are controlled in accordance with the command from the CPU 15.

Figure 2A:
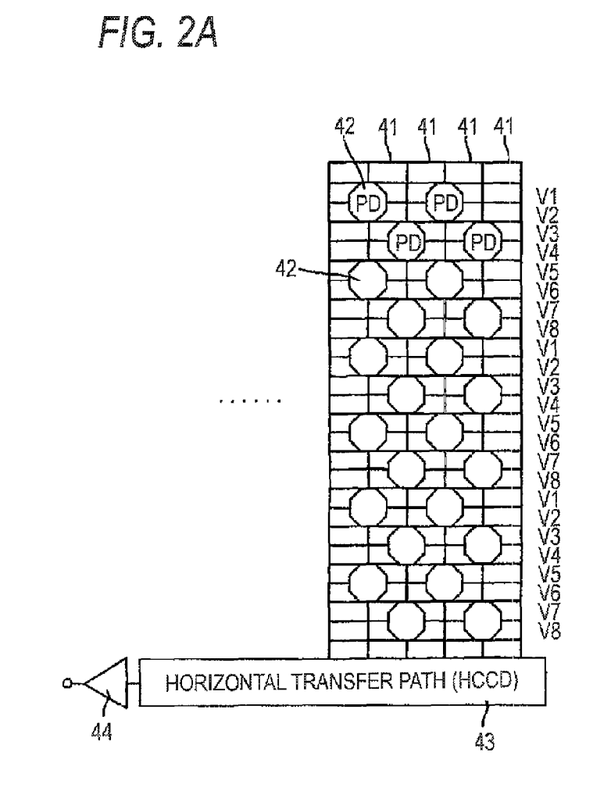
FIGS. 2A and 2B are surface schematic view showing an example of the solid-state imaging device shown in FIG. 1.
Figure 2B:
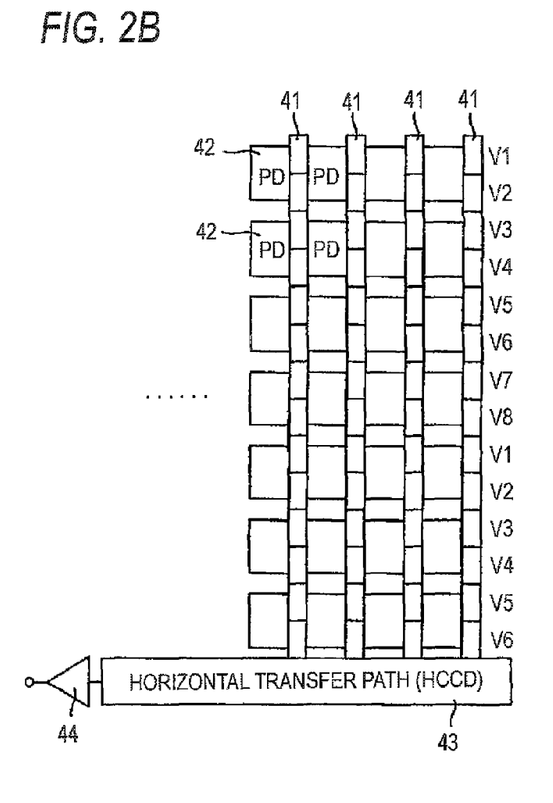

FIG. 2 is a surface schematic view of the CCD-type solid-state imaging device shown in FIG. 1. Specifically, FIG. 2A shows a solid-state imaging device having photoelectric conversion elements (photodiodes (PD): pixels) 42 arranged in a so-called honeycomb structure, that is, a solid-state imaging device in which odd-row pixels 42 and even-row pixels 42 are shifted at ½ pitch. FIG. 2B shows a solid-state imaging device having photoelectric conversion elements 42 arranged in a square lattice.

The digital still camera of this embodiment can be applied to any of the solid-state imaging devices shown in FIGS. 2A and 2B. Also, the digital still camera of this embodiment may be applied to any another type of solid-state imaging device having a vertical charge transfer path.

Vertical charge transfer paths (VCCD) 41 are formed along the columns of the photoelectric conversion elements arranged in a vertical direction. Also, a horizontal charge transfer path (HCCD) 43 is formed along end portions of the vertical charge transfer paths 41. An output amplifier 44 is formed in an output terminal of the horizontal charge transfer path 43 and outputs a voltage signal corresponding to an amount of a signal charge transferred thereto.

Symbols V1, V2, . . . arranged along the vertical charge transfer paths 41 shown in FIG. 2 represent transfer electrodes of the vertical charge transfer paths 41. For example, a potential packet is formed under the consecutive transfer electrodes V1, V2, and V3 and charges detected by the photoelectric conversion elements 42 beside the transfer electrode V1 are read out to the potential packet.

Then, a length of the potential packet corresponding to the three electrodes is expanded by a length corresponding to one electrode toward the horizontal charge transfer path 43, that is, the potential packet is expanded to locate under the electrodes V1, V2, V3, and V4. Subsequently, the potential packet is contracted to locate under the electrodes V2, V3, and V4. Then, the potential packet is expanded to locate under the electrodes V2, V3, V4, and V5. Subsequently, the potential packet is contracted to locate under the electrodes V3, V4, and V5. Such expansions and contractions are repeated until the signal charges are transferred to the horizontal charge transfer path 43.

In the above description on the transfer driving, for the sake of simple explanation, the capacity of the potential packet is set to at least a capacity corresponding to three electrodes. However, in a solid-state imaging device that is manufactured so that the width of the vertical charge transfer path is small as compared with the light receiving area of the photoelectric conversion element, it is necessary to form the potential packet so as to have a length corresponding to more consecutive electrodes. In this case, the potential packet having such a length is expanded and contracted, thereby transferring the signal charges.

FIG. 3 is a diagram for explaining a method for driving the vertical charge transfer path according to an embodiment of the invention.

Figure 3A:
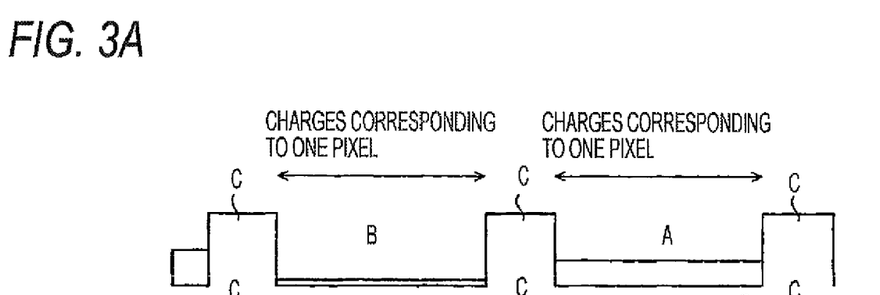
FIG. 3 is a timing chart showing a method for driving a vertical charge transfer path before a vertical charge transfer in the solid-state imaging device shown in FIG. 1 is started.

First, the CPU 15 of FIG. 1 outputs a control command to the imaging element driving section 20 (i) to apply an intermediate voltage of 0 V, for example, to plural consecutive electrodes, thereby forming potential packets having large capacity (large length; FIG. 3A shows two potential packets A and B) and (ii) to apply a low voltage of −8 V, for example, to electrodes between the potential packets, thereby forming partition barriers C that from boundaries between the potential packets, as shown in FIG. 3A.

Then, a high voltage of +15 V, for example, is applied to a transfer electrode which also serves as a reading electrode and which is adjacent to one photoelectric conversion element beside each potential packet. Thereby, charges detected by each photoelectric conversion elements are read into the corresponding adjacent potential packet.

In the example shown in the figure, accumulation charges (having a large signal charge amount) being accumulated in a photoelectric conversion element that takes a high luminance portion of a photographic image of one screen are read into the potential packet A, while accumulation charges (having a small signal charge amount) being accumulated in a photoelectric conversion element that takes a low luminance portion (for example, shadow portions of the photographic image) are read into the potential packet B.

If the potential packets A and B are simply expanded and contracted so as to be transferred toward the horizontal charge transfer path (toward the left side of the figure), since the lengths of the potential packets A and B are large, a large amount of dark current would be mixed into the signal charges in the packets A and B.

Also, the amount of generated dark current is proportional to a charge transfer time. Therefore, at an early stage before the charge transfer, that is, immediately after the signal charges are read into the potential packets, the potential packet A is divided into two potential packets A1 and A2 and similarly the potential packet B is divided into two potential packets B1 and B2. Then, the signal charges are driven to be transferred toward the horizontal charge transfer path.

Figure 3B:
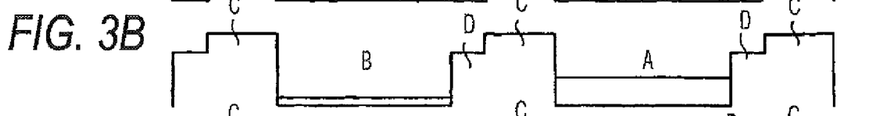

Therefore, at first, as shown in FIG. 3B, a low voltage of −2 V, for example, that is slightly lower than the intermediate voltage (0 V in this example) is applied to the electrodes in the rear end, in the transfer direction, of each of the potential packets A and B, thereby forming a split barrier D that is slightly lower than the partition barrier C forming the boundary between the potential packets A and B. As a result, the signal charges in the potential packets A and B are concentrated on the forward side in the transfer direction.

Figure 3C:
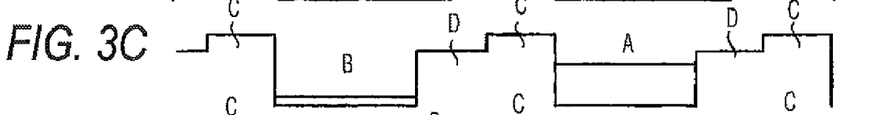

Furthermore, a voltage of −2 V is applied to an electrode adjacent, in the forward transfer direction, to each electrode to which the voltage of −2 V has been applied, thereby increasing the width of the split barrier D. As a result, as shown in FIG. 3C, the signal charges in the potential packets A and B are further concentrated on the forward side in the transfer direction.

Figures 3D, 3E:
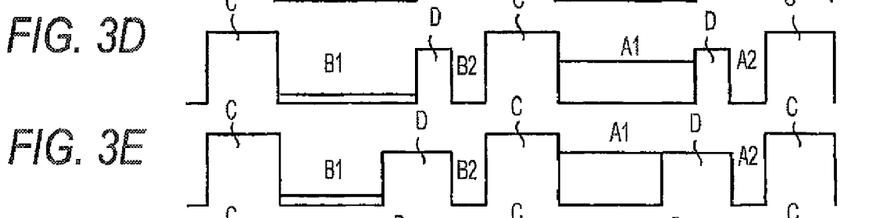
Figure 3F:
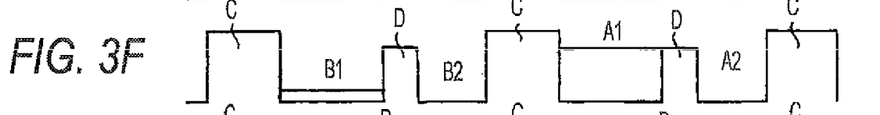

Next, as shown in FIG. 3D, the intermediate voltage of 0 V is applied to the electrodes, which have been applied with the voltage of −2 V and which are adjacent to the partition barriers C, thereby forming second segment potential packets A2 and B2. Then, as shown in FIGS. 3E, 3F, and 3G, while changing the number of electrodes having formed therein the split barrier D two electrodes→one electrode→two electrodes, the split barrier D is moved to the central position in each of the potential packets A and B of FIG. 3A.

In this way, the potential packet A is divided into two segment potential packets A1 and A2 having the same capacity while the signal charges in the potential packet A are concentrated on the forward side in the transfer direction. In the example shown in the figure, since the amount of the signal charges in the potential packet A is greater than the capacity of the first segment potential packet A1, the excess signal charges overflows the split barrier D, which is lower than the partition barrier C, into the second segment potential packet A2.

In the shown example, although the potential packet B is similarly divided into the first and second potential packets B1 and B2, since the amount of the signal charges in the potential packet B is smaller than the capacity of the segment potential packet B1, the second segment potential packet B2 becomes an empty packet.

Figure 3G:
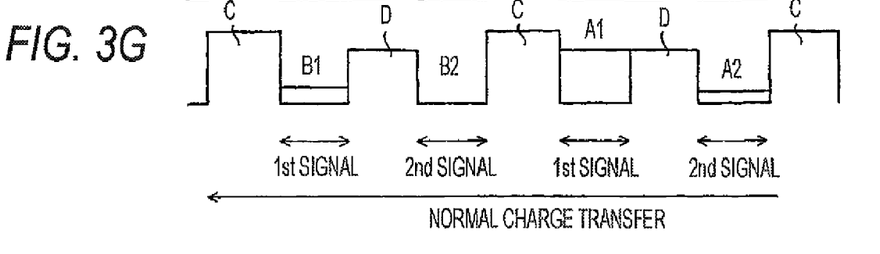
Figure 4A:
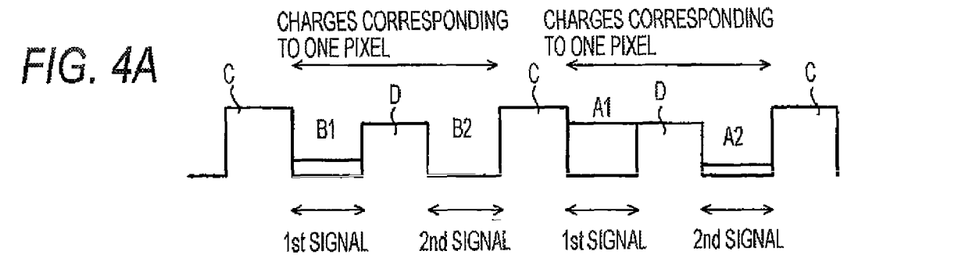
FIG. 4 is a timing chart showing the vertical charge transfer, which is performed after the driving method of FIG. 3 is performed.

In this embodiment, in the manner described above, the potential packets A and B are respectively divided into the two segment potential packets and the signal charges in each potential packet are divided into a first signal component in the first segment potential packets A1 and B1 and a second signal component in the second segment potential packets A2 and B2 (FIG. 4A=FIG. 3G).

Figure 4B:
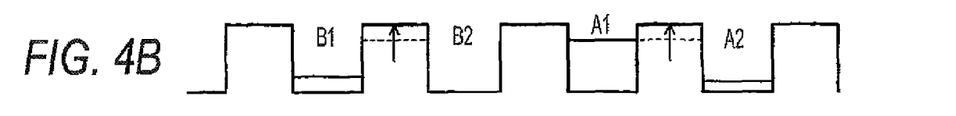
Figure 4C:
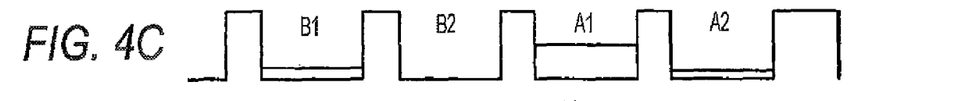
Figure 4D:
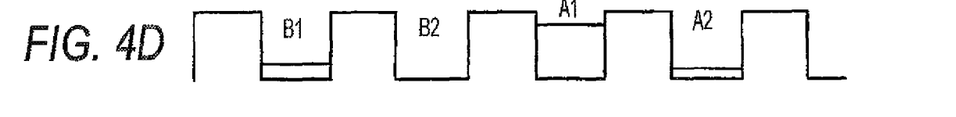

Then, as shown in FIG. 4B, the split barrier D is made to have the same height as the partition barrier C, and the signal charges are transferred to the horizontal charge transfer path while expanding and contracting the lengths of the potential packets B1, B2, A1, and A2, as shown in FIGS. 4C and 4D. Thereafter, the signal charges are transferred to the output amplifier along the horizontal charge transfer path, and voltage signals are output from the output amplifier. It is noted that it is not necessary to make the barrier D to have the same height as the barrier C. However, by equalizing the height, it becomes easy to create transfer pulses that are generated by binary signals.

From the output amplifier, the voltage signals corresponding to the amount of the charges transferred by the potential packet B1, the voltage signals corresponding to the amount of the charges transferred by the potential packet B2, the voltage signals corresponding to the amount of the charges transferred by the potential packet A1, and the voltage signals corresponding to the amount of the charges transferred by the potential packet A2 are output. The voltage signals are processed by the analogue signal processor 22 of FIG. 1, are subjected to the A/D conversion, and are then stored in the main memory 24.

The digital signal processor 26 performs an addition/subtraction process for the first signal component transferred by the segment potential packets A1 and B1 and the second signal component transferred by the segment potential packets A2 and B2, thereby generating imaging data.

Figure 5:
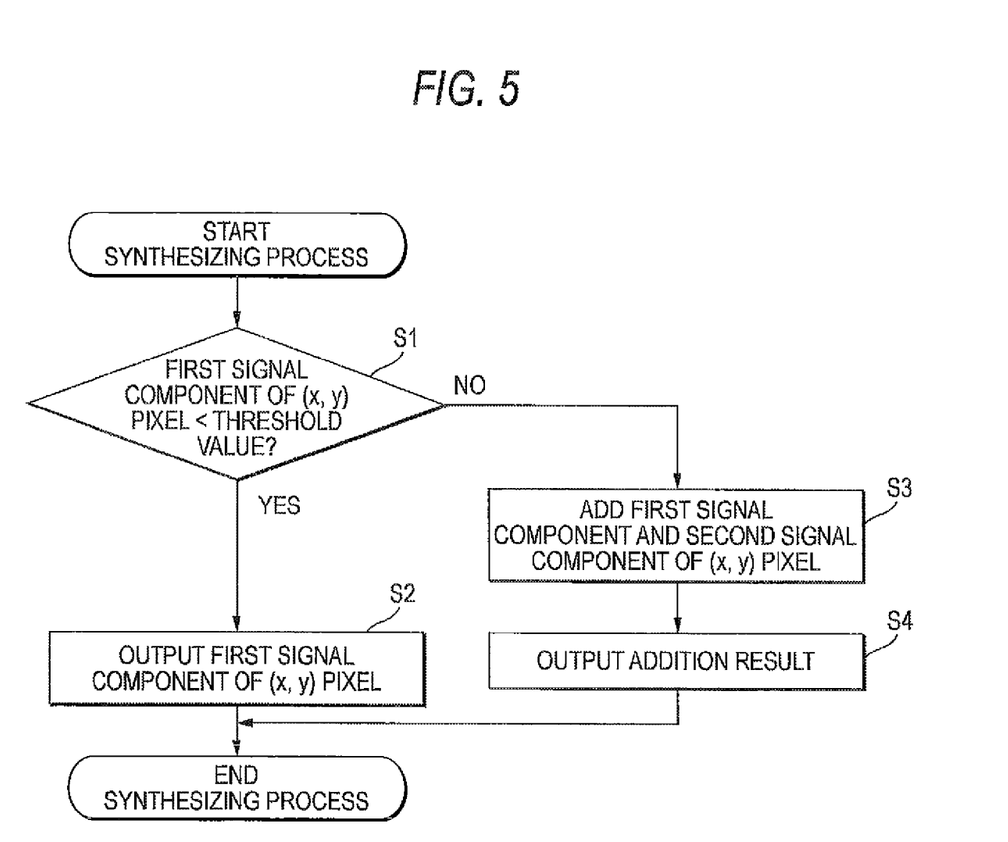
FIG. 5 is a flow chart showing an image synthesizing process of a first example when an image is synthesized from a first signal component and a second signal component that are obtained by the vertical charge transfer of FIG. 4.

FIG. 5 is a flow chart showing the procedure of a synthesizing process according to a first example that is executed by the digital signal processor 26. First, the first signal component and the second signal component of a pixel located at coordinate (x, y) on the light receiving surface of the semiconductor substrate are fetched from the main memory 24. Then, it is determined as to whether or not the first signal component is smaller than a threshold value (step S1). The threshold value is stored in advance in the ROM 15a of FIG. 1 and represents the saturation charge capacity (the capacity in the state of FIG. 3G) of the segment potential packets A1, B1, A2, and B2.

If the first signal component is smaller than the threshold value (if the determination result is affirmative (Yes)), it can be determined that the original signal charge amount is small and the signal charges are transferred in the state of the potential packets B1 and B2 shown in FIG. 4D. That is, it can be determined that the second segment potential packet B2 is an empty packet and the signal charges are not present in the segment potential packet B2. Thus, the procedure proceeds to step S2 in which the first signal component is output as imaging data of the pixel at coordinate (x, y).

If it is determined in step S1 that the first signal component is equal to or greater than the threshold value (if the determination result is negative (No)), it can be determined that the original signal charge amount is large and the signal charges are transferred in the state of the potential packets A1 and A2 shown in FIG. 4D. That is, it can be determined that the signal charges are also present in the second segment potential packet A2. Thus, in this case, the procedure proceeds to step S3 in which the first signal component is added to the second signal component and the addition result is output as the imaging data of the pixel at coordinate (x, y) (step S4).

Figure 6:
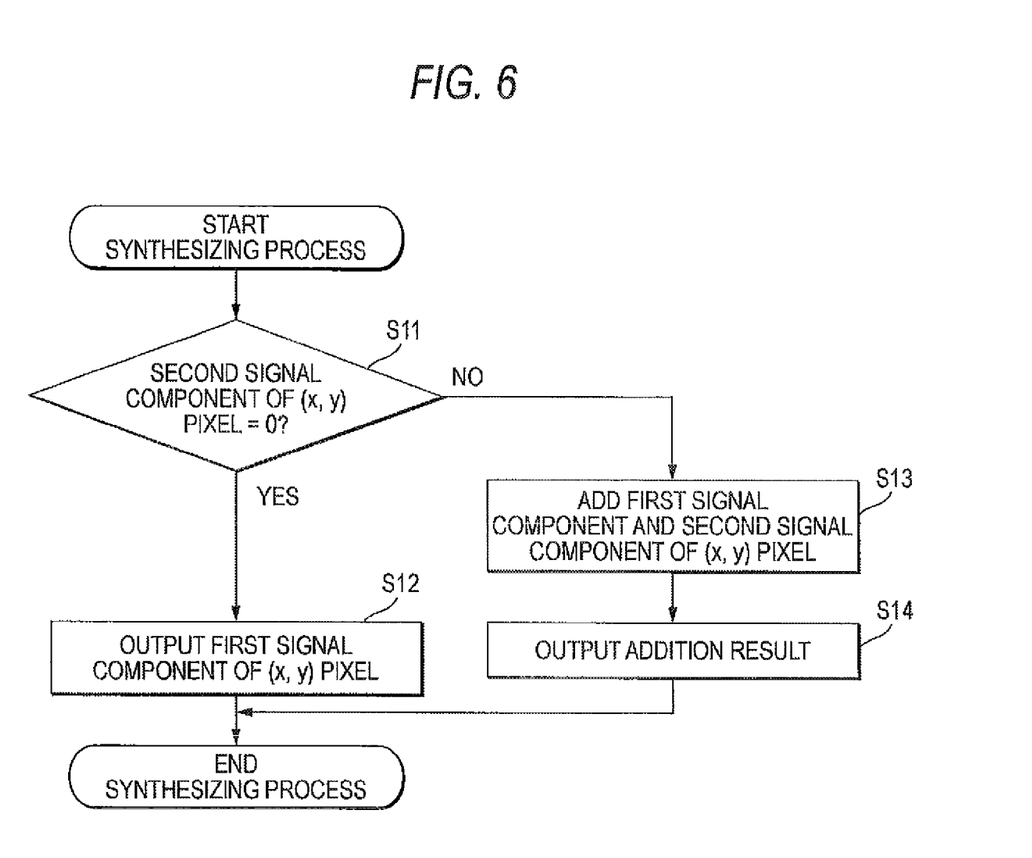
FIG. 6 is a flow chart showing an image synthesizing process of a second example when an image is synthesized from a first signal component and a second signal component that are obtained by the vertical charge transfer of FIG. 4.

FIG. 6 is a flow chart showing the procedure of a synthesizing process according to a second example that is executed by the digital signal processor 26. In this example, first, the first signal component and the second signal component of a pixel at coordinate (x, y) on the light receiving surface of the semiconductor substrate are fetched from the main memory 24. Then, it is determined as to whether or not the second signal component is equal to "0" (or equal to or smaller than a threshold value that can be considered as 0; step S11).

If the second signal component is equal to "0" (if the determination result is affirmative (Yes)), it can be determined that the original signal charge amount is small and the signal charges are transferred in the state of the potential packets B1 and B2 shown in FIG. 4D. That is, it can be determined that the potential packet B2 is an empty packet.

Thus, the procedure proceeds to step S12 in which the first signal component is output as imaging data of the pixel at the coordinate (x, y).

If it is determined in step S11 that the second signal component is not equal to "0" (if the determination result is negative (No)), it can be determined that the original signal charge amount is large and the signal charges are transferred in the state of the potential packets A1 and A2 shown in FIG. 4D. That is, it can be determined that the signal charges are present in both the potential packets A1 and A2. Thus, in this case, the procedure proceeds to step S13 in which the first signal component is added to the second signal component and the addition result is output as the imaging data of the pixel at the coordinate (x, y) (step S14).

In the image synthesizing process of FIGS. 5 and 6, the sum of the signal charges, which are transferred by the two potential packets, that is, the potential packet A1 and the potential packet A2 shown in FIG. 4D, corresponds to the original signal charge amount. Compared with the case where the summed signal charges are transferred by the potential packet A of the large capacity shown in FIG. 3A, the number of electrodes constituting the potential packets A1 and A2 is smaller than the number of electrodes constituting the potential packet A. Therefore, the amount of dark current contained in the signal charges can be decreased as the number of electrodes decreases. Accordingly, it is possible to provide high-quality image data.

The segment potential packets B1 and B2 are processed in a similar manner. However, if the signal charges are transferred by the potential packets B1 and B2, the signal charges of the potential packet B2 are not added. Therefore, the amount of dark current becomes half as compared with the case where the signal charges are added. Therefore, it is possible to further decrease noise in a dark portion, such as shadow, in the taken images of one screen.

Figure 7:
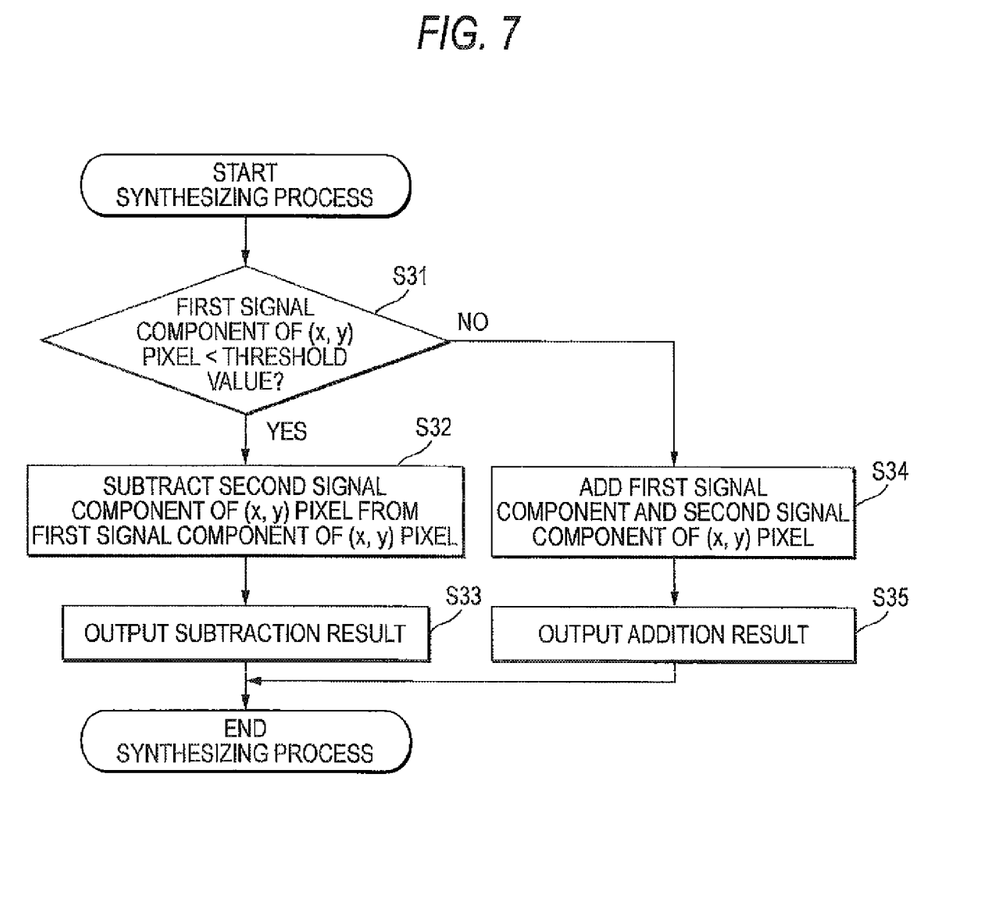
FIG. 7 is a flow chart showing an image synthesizing process of a third example when an image is synthesized from a first signal component and a second signal component that are obtained by the vertical charge transfer of FIG. 4.

FIG. 7 is a flow chart showing the procedure of a synthesizing process according to a third example that is executed by the digital signal processor 26. In this example, first, the first signal component and the second signal component of a pixel at coordinate (x, y) on the light receiving surface of the semiconductor substrate are fetched from the main memory 24. Then, it is determined as to whether or not the first signal component is smaller than a threshold value (step S31). Similar to the first example, the threshold value is stored in advance in the ROM 15a of FIG. 1 and represents the saturation charge capacity of the segment potential packets A1, B1, A2, and B2.

If the first signal component is smaller than the threshold value (if the determination result is affirmative (Yes)), it can be determined that the original signal charge amount is small and the signal charges are transferred in the state of the potential packets B1 and B2 shown in FIG. 4D. That is, it can be determined that the potential packet B2 is an empty packet and the signal charges are not present in the packet B2.

Even if an empty packet is transferred, charges corresponding to the dark current being generated in the empty packet are held in the empty packet and transferred. That is, signals of the dark current noise are output as the second signal component from the output amplifier.

It can be determined that the amount of the dark current mixed into the segment potential packet B2 is the same as the amount of the dark current mixed into the segment potential packet B1 that has been previously transferred. Thus, in this example, when the determination result in step S31 is affirmative (Yes), the second signal component is subtracted from the first signal component (step S32), and the subtraction result is output as the taken data of the pixel at the coordinate (x, y) (step S33).

If it is determined in step S31 that the first signal component is equal to or greater than the threshold value (if the determination result is negative (No)), it can be determined that the original signal charge amount is large and the signal charges are transferred in the state of the potential packets A1 and A2 shown in FIG. 4D. That is, it can be determined that the signal charges are also present in the potential packet A2. Thus, in this case, the first signal component is added to the second signal component (step S34) and the addition result is output as the imaging data of the pixel at the coordinate (x, y) (step S35).

In this way, according to this example, since the dark current component is subtracted from the charge signals of the segment potential packet B1, it is possible to further decrease noise at dark portions as compared with the first and second examples.

High luminance image portions originally have a large signal amount even if the dark current noise component is not removed therefrom. Therefore, it is possible to obtain imaging data having a high S/N ratio. However, if an empty packet such as the potential packet B2 is present in the neighborhood of the potential packets A1 and A2 that transfer the signal charges of the high luminance portions, it is possible to detect the dark current component transferred by the empty packet. Therefore, by correcting the neighboring high luminance image portion using the noise component, it is possible to further increase the S/N ratio of the high luminance image portion.

In the embodiments and examples described above, one potential packet is divided into two segment potential packets having the same capacity. However, one potential packet may be divided into three or more segment potential packets. Also, it is not necessary that the segment potential packets have the same capacity.

Also, in the embodiments and the examples, one potential packet A (or B) for reading signal charges of one pixel is divided into the segment potential packets A1 and A2 (or B1 and B2) having the same capacity by moving the split barrier C toward the rear side, in the transfer direction, of the potential packet A (or B).

This is because when the direction of expanding and contracting the signal charges within the potential packet A (or B) is the same as the transfer direction, the transfer error would less occur and hence high image quality can be obtained. However, in a charge transfer path where the transfer error is less likely to occur, the direction of expanding and contracting the signal charges may be opposite to the transfer direction.

The driving method of the CCD-type solid-state imaging device according to the embodiments and the examples of the invention can decrease dark current noise at dark portions of a screen while maintaining an optical dynamic range of a taken image. Therefore, it is possible to take a high quality image and hence the driving method can be effectively used in a digital camera.

What is claimed is:

1. A method for driving a CCD-type solid-state imaging device, the method comprising:
    reading charges detected by photoelectric conversion elements into potential packets formed in a charge transfer path, each potential packet representing charge of one photoelectric conversion element, said potential packets separated by partition barriers;
    dividing each potential packet into plural segment packets while narrowing a range where the charges are present in each potential packet, by forming a split barrier and moving the split barrier from one side of each potential packet toward the other side of each potential packet, wherein each split barrier has a lower potential height than a partition barrier that forms a boundary between the adjacent potential packets; and
    transferring the charges along the charge transfer path after the dividing.

2. The method according to claim 1, further comprising:
    making the barrier heights of the split barriers be equal to that of the partition barriers before the transferring.

3. The method according to claim 2, wherein a direction in which the split barriers are moved is the same as a direction in which the charges are transferred.

4. The method according to claim 2, wherein the plurality of segment potential packets are formed to have the same capacity.

5. The method according to claim 3, wherein the plurality of segment potential packets are formed to have the same capacity.

6. The method according to claim 1, wherein a direction in which the split barriers are moved is the same as a direction in which the charges are transferred.

7. The method according to claim 6, wherein the plurality of segment potential packets are formed to have the same capacity.

8. The method according to claim 1, wherein the plurality of segment potential packets are formed to have the same capacity.

9. The method according to claim 1, further comprising:
    dividing each potential packet into plural segment packets such that the charges are present in one of the plural segment packets and the charges are absent in the other segment packets of the plural segment packets while narrowing a range of the one segment packet in each potential packet, and
    transferring excess charges in the one segment packet into the other segment packet when an amount of the charges in the one segment packet is greater than a capacity of the one segment.

10. An imaging apparatus comprising:
    a CCD-type solid-state imaging device that includes
        a plurality of photoelectric conversion elements arranged in two-dimensional array, and
        a charge transfer path; and
    a driving control unit that
        forms potential packets in the charge transfer path,
        reads charges detected by the photoelectric conversion elements into the potential packets, each potential packet representing charge of one photoelectric conversion element, said potential packets separated by partition barriers,
        divides each potential packet into plural segment packets while narrowing a range where the charges are present in each potential packet, by forming a split barrier and moving the split barrier from one side of each potential packet toward the other side of each potential packet, wherein each split barrier has a lower potential height than a partition barrier that forms a boundary between the adjacent potential packets, and
        transfers the charges along the charge transfer path after the dividing.

11. The imaging apparatus according to claim 10, wherein the driving control unit makes the barrier heights of the split barriers be equal to that of the partition barriers before the driving control unit transfers the charges.

12. The imaging apparatus according to claim 10, wherein the driving control unit controls so that a direction in which the split barriers are moved is the same as a direction in which the charges are transferred.

13. The imaging apparatus according to claim 10, wherein the driving control unit controls so that the plurality of segment potential packets are formed to have the same capacity.

14. The imaging apparatus according to claim 10, further comprising:
   a signal processing unit that synthesizes signals obtained from the charges transferred by the plural segment packets, which are formed by dividing each potential packet, to generate image data for the photoelectric conversion element corresponding to each potential packet.

15. The imaging apparatus according to claim 14, wherein when it is determined that any of the plural segment packets, which are obtained by dividing one potential packet, is an empty packet, the signal processing unit synthesizes signals obtained from the charges transferred by segment packets, which are formed by dividing the one potential packet but are not the empty packet, to generate the image data and does not add a signal obtained from the empty packet.

16. The imaging apparatus according to claim 14, wherein when it is determined that any of the plural segment packets, which are obtained by dividing one potential packet, is an empty packet, the signal processing unit corrects signals obtained from the charges transferred by the segment packets other than the empty packet, using as a dark-current noise signal a signal obtained from charges transferred by the empty packet.

17. The imaging apparatus according to claim 14, wherein when it is determined that none of the plural segment packets, which are obtained by dividing one potential packet, is an empty packet, the signal processing unit adds the signals obtained from the charges transferred by the respective segment packets to generate the image data for the photoelectric conversion element corresponding to the one potential packet.

18. A method for driving a CCD-type solid-state imaging device, the method comprising:
   reading charges detected by photoelectric conversion elements into potential packets formed in a charge transfer path, each potential packet representing charge of one photoelectric conversion element, formed under a predetermined range of consecutive transfer electrodes of the charge transfer path, and said potential packets separated by partition barriers;
   dividing each potential packet into plural segment packets of a lower charge capacity than the potential packets while narrowing the predetermined range of consecutive transfer electrodes under which the charges are present in each potential packet, by forming a split barrier and moving the split barrier from one side of each potential packet toward the other side of each potential packet, wherein each split barrier has a lower potential height than a partition barrier that forms a boundary between the adjacent potential packets; and
   transferring the charges along the charge transfer path after the dividing.

* * * * *